(12) United States Patent
Wu et al.

(10) Patent No.: US 11,828,825 B2
(45) Date of Patent: Nov. 28, 2023

(54) SYSTEM AND METHOD FOR INTEGRATED TIME-RESOLVED 4D FUNCTIONAL AND ANATOMICAL MRI

(71) Applicants: UNIVERSITY OF PITTSBURGH-OF THE COMMONWEALTH SYSTEM OF HIGHER EDUCATION, Pittsburgh, PA (US); CEDARS-SINAI MEDICAL CENTER, Los Angeles, CA (US)

(72) Inventors: Yijen Lin Wu, Wexford, PA (US); Anthony Christodoulou, Los Angeles, CA (US)

(73) Assignees: University of Pittsburgh—Of the Commowealth System of Higher Education, Pittsburgh, PA (US); Cedars-Sinai Medical Center, Los Angeles, CA (US)

( * ) Notice: Subject to any disclaimer, the term of this patent is extended or adjusted under 35 U.S.C. 154(b) by 273 days.

(21) Appl. No.: 17/245,342

(22) Filed: Apr. 30, 2021

(65) Prior Publication Data

US 2021/0349167 A1    Nov. 11, 2021

Related U.S. Application Data

(60) Provisional application No. 63/021,940, filed on May 8, 2020.

(51) Int. Cl.
*G01R 33/563* (2006.01)
*G01R 33/48* (2006.01)
*G01R 33/561* (2006.01)

(52) U.S. Cl.
CPC ... *G01R 33/56308* (2013.01); *G01R 33/4818* (2013.01); *G01R 33/5611* (2013.01)

(58) Field of Classification Search
CPC .......... G01R 33/56308; G01R 33/4818; G01R 33/5611
See application file for complete search history.

(56) References Cited

U.S. PATENT DOCUMENTS

| 8,989,465 B2 | 3/2015 | Trzasko et al. |
| 2016/0202336 A1* | 7/2016 | Liang .................. G01R 33/561 |
| | | 324/309 |
| 2017/0299681 A1 | 10/2017 | Trzasko |

FOREIGN PATENT DOCUMENTS

WO    2014162300 A1    10/2014

OTHER PUBLICATIONS

Khalsa, K., "Temporal Regularization Use in Dynamic Contrast-Enhanced MRI," Dissertation of Biomedical Engineering at the University of Michigan. 2011. p. 1-139 (Year: 2011).*

(Continued)

*Primary Examiner* — Christopher Koharski
*Assistant Examiner* — Sean A Frith
(74) *Attorney, Agent, or Firm* — Philip E. Levy; Ecket Seamans Cherin & Mellott, LLC (57) ABSTRACT

A magnetic resonance imaging method is includes collecting spatially encoded data from a subject using an MRI system, and directly extracting a number of temporal basis functions using at least a first portion of the spatially encoded data. The method further includes, after directly extracting the number of temporal basis functions, iteratively calculating a number of coefficient images using the number of temporal basis functions and at least a second portion of the spatially encoded data. Finally, the method includes generating a 4D image based on the number of temporal basis functions and the number of coefficient images.

19 Claims, 2 Drawing Sheets

(56) References Cited

OTHER PUBLICATIONS

Wang, G., "High Temporal-Resolution Dynamic PET Image Reconstruction Using a New Spatiotemporal Kernel Method," IEEE Transactions on Medical Imaging. vol. 38(3), 2019. p. 664-674 (Year: 2019).*

Reader, A., et al., "Joint estimation of dynamic PET images and temporal basis functions using fully 4D ML-EM," Physics in Medicine and Biology. vol. 51, 2006. p. 5455-5474 (Year: 2006).*

Christodoulou, A., et al., "Accelerating Cardiovascular Imaging by Exploiting Regional Low-Rank Structure Via Group Sparsity," Proc IEEE Int Symp Biomed Imaging. 2012. p. 330-333 (Year: 2012).*

In utero 4D CMR with Low-rank Imaging and Compressed Sensing, Yijen L Wu, PhD.1, Anthony G. Christodoulou, PhD.2, Cecilia Lo PhD; SCMR 22nd Annual Scientific Sessions, Bellevue, WA, Feb. 6-9, 2019.

"Concomitant Fetal Heart and Brain MRI in Congenital Heart Disease Mouse Models with Sub-Nyquist Acquisition" YL Wu, AG Christodoulou, C Lo.1, AHA Annual Meeting, Chicago, IL, Nov. 10-12, 2018.

A. G. Christodoulou, H. Zhang, B. Zhao, T. K. Hitchens, C. Ho and Z. Liang, "High-Resolution Cardiovascular MRI by Integrating Parallel Imaging With Low-Rank and Sparse Modeling," in IEEE Transactions on Biomedical Engineering, vol. 60, No. 11, pp. 3083-3092, Nov. 2013, doi: 10.1109/TBME.2013.2266096.

Trzasko, J. & Manduca, A. & Borisch, Eric. (2011). Local versus global low-rank promotion in dynamic MRI series reconstruction. Proc. Int. Symp. Magn. Reson. Med.

Z. Liang, "Spatiotemporal Imaging With Partially Separable Functions," 2007 4th IEEE International Symposium on Biomedical Imaging: From Nano to Macro, 2007, pp. 988-991, doi: 10.1109/ISBI.2007.357020.

* cited by examiner

SYSTEM AND METHOD FOR INTEGRATED TIME-RESOLVED 4D FUNCTIONAL AND ANATOMICAL MRI

CROSS-REFERENCE TO RELATED APPLICATIONS

This application claims priority under 35 U.S.C. § 119(e) from U.S. provisional patent application No. 63/021,940, entitled "System and Method for Integrated Time-Resolved 4D Functional and Anatomical MRI" and filed on May 8, 2020, the contents of which are incorporated herein by reference.

GOVERNMENT CONTRACT

This invention was made with government support under grant #EB023507 awarded by the National Institutes of Health (NIH) and under grant #W81XWH-18-1-0070 awarded by the Army/MRMC. The government has certain rights in the invention.

BACKGROUND OF THE INVENTION

1. Field of the Invention

The present invention relates to Magnetic Resonance Imaging (MRI), and, in particular, to a system and method for improved four dimensional (4D) MRI image acquisition for simultaneous structural/morphological and functional visualization of tissues, such as, without limitation, fetuses, placentas and organs such as the brain and heart.

2. Description of the Related Art

Fetal Imaging plays a vital role in the diagnosis and treatment planning for cardiac and central nervous system problems, particularly brain anomalies, that are discovered in utero. Although ultrasound is currently the primary modality for evaluating fetuses due to its spatial and temporal resolution, widespread availability, and ease-of-use, ultrasound is limited in its ability to visualize the developing brain and heart and detect abnormalities in neuronal or cardiac development. For example, fetal MRI may be used to detect subtle neural tube defects not shown by ultrasound and to determine the level of the defect in spina bifida for potential fetal surgery. Consequently, there is a growing interest in the use of MRI as an adjunct diagnostic tool for the fetal heart, brain, lungs, liver, and other organs when inconclusive sonographic findings are limited by factors such as maternal obesity, reduced abnormal fluid volumes, multiple fetuses, congenital diaphragm abnormalities, or fetal bone developments in late gestation.

Conventional MRI has also been used to evaluate placental position, attachment, and depth invasion of the placenta into the uterine lining, without the need for contrast. Likewise, abnormal placental morphology, such as accessory lobes, can be well visualized by conventional MRI. These accessory lobes increase the risk of postpartum hemorrhage or fetal exsanguination. The accurate detection of such implantation anomalies has immediate clinical significance in the delivery and surgical planning for the obstetrician, given the significant risk of post-partum hemorrhage and maternal morbidity and mortality.

Despite its technological superiority over ultrasound in imaging a developing fetus, current MRI diagnostic imaging is restricted to the visualization of aberrations in morphological structures. In imaging brain and other neurological processes or the heart, however, MRI is limited in use because it only shows a static image of the brain or the heart (an anatomical image), not an image of their actual activity. Apart from the challenges associated with imaging a small, rapidly beating heart that is subject to various regular and spontaneous movements within the maternal body, it is also important for an advanced MRI system to evaluate fetal cardiac anatomy, function, blood flow, and oximetry. Consequently, achieving clinically useful spatial and temporal resolution while maintaining a reasonable scan time is difficult with the conventional MRI sequences available on most scanners. Managing the length of fetal MRI acquisitions is particularly important given the periodic motions (fetal respiratory movements, fetal cardiac motion, maternal respiration) and stochastic motions (gross fetal movement) that can degrade image quality. Similarly, for capturing functional brain images in utero, the image quality of a conventional MRI changes with gestational age that is related to intensity of neurogenic events. It is also incapable of measuring hemodynamic responses of the brain and differentiating functional active areas of the brain (e.g., areas undergoing rapid changes in blood delivery) from inactive areas. In addition, conventional MRI methods do not help in understanding the origins of neurodevelopment and where brain function goes awry when connections are being made between the brain cells Some limitations of conventional MRI are solved by functional MRI (fMRI), which uses the same basic principles as MRI. However, whereas conventional MRI images anatomical structures, fMRI images metabolic function. For example, fMRI measures the small changes in blood flow that occur with brain activity. This is known as the Blood-Oxygenation Level Dependent response (otherwise known as BOLD). The application of fMRI, however, is restricted to its use in examining the brain's functional anatomy (determining which parts of the brain are handling critical functions), evaluating the effects of stroke or other disease, or to guide brain treatment. fMRI is not used for evaluating other developing organs of a fetus. Moreover, the flexibility of MRI/fMRI comes at the expense of long scan times compared to other imaging modalities. Spatial localization of the MRI signal is one of the main reasons for this long scan time. The basic steps of every pulse sequence—radiofrequency excitation, gradient encoding, and data acquisition—must be repeated many times to generate an image.

Therefore, in current MRI practice, particularly in fetal imaging, there is a need for a technique for observing anatomical variations as well as understanding dynamic functional aspects (e.g., of the fetus and placenta). In the case of fetal imaging, there is also the need to solve the problem of dynamic imaging the fetus and placenta with high enough frame rates to resolve fetal and maternal motion as well as potential external dynamic effects (such as tissue response to changing external oxygen supply).

SUMMARY OF THE INVENTION

In one embodiment, a magnetic resonance imaging method is provided that includes collecting spatially encoded data from a subject using an MRI system, and directly extracting a number of temporal basis functions using at least a first portion of the spatially encoded data. The method further includes, after directly extracting the number of temporal basis functions, iteratively calculating a number of coefficient images using the number of temporal basis functions and at least a second portion of the spatially encoded data. Finally, the method includes generating a 4D image based on the number of temporal basis functions and the number of coefficient images.

In another embodiment, a magnetic resonance imaging system is provided that includes a magnet, an RF system, and a controller. The controller is structured and configured for causing spatially encoded data to be collected from a subject using the magnet and the RF system, directly extracting a number of temporal basis functions using at least a first portion of the spatially encoded data, after directly extracting the number of temporal basis functions, iteratively calculating a number of coefficient images using the number of temporal basis functions and at least a second portion of the spatially encoded data, and generating a 4D image based on the number of temporal basis functions and the number of coefficient images.

DETAILED DESCRIPTION OF EXEMPLARY EMBODIMENTS

As used herein, the singular form of "a". "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs.

As used herein, "directly coupled" means that two elements are directly in contact with each other.

As used herein, the term "number" shall mean one or an integer greater than one (i.e., a plurality).

As used herein, the term "controller" shall mean a programmable analog and/or digital device (including an associated memory part or portion) that can store, retrieve, execute and process data (e.g., software routines and/or information used by such routines), including, without limitation, a field programmable gate array (FPGA), a complex programmable logic device (CPLD), a programmable system on a chip (PSOC), an application specific integrated circuit (ASIC), a microprocessor, a microcontroller, a programmable logic controller, or any other suitable processing device or apparatus. The memory portion can be any one or more of a variety of types of internal and/or external storage media such as, without limitation, RAM, ROM, EPROM(s). EEPROM(s). FLASH, and the like that provide a storage register, i.e., a non-transitory machine readable medium, for data and program code storage such as in the fashion of an internal storage area of a computer, and can be volatile memory or nonvolatile memory.

As used herein, the terms "component" and "system" are intended to refer to a computer related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, and a component can be localized on one computer and/or distributed between two or more computers. While certain ways of displaying information to users are shown and described with respect to certain figures or graphs as screenshots, those skilled in the relevant art will recognize that various other alternatives can be employed.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The disclosed concept will now be described, for purposes of explanation, in connection with numerous specific details in order to provide a thorough understanding of the subject invention. It will be evident, however, that the disclosed concept can be practiced without these specific details without departing from the spirit and scope of this innovation.

As described in detail herein, the disclosed concept combines the sharp spatial resolution of traditional MRI with the high frame-rate of functional MRI (fMRI), and provides a time resolved 4D MRI (e.g., in utero MRI) system and method that allows not only full 3D isotropic morphological imaging of tissues and organs, such as, without limitation, fetuses and placentas, but also simultaneous functional imaging, such as cardiac functions, blood flow, oxygenation mapping, and fast blood-oxygenation dependent (BOLD) responses, in the same single scan with both high spatial and temporal resolutions. The technique of the disclosed concept can thus be used to study and assess, among other things, fetal and placental development, morphology, and functions simultaneously. In addition, the system and method of the disclosed concept allow for the imaging of multiple fetuses and placenta, even when the fetal motions are uncorrelated. The high frame rate (e.g., over 60 frames per second) reduces unwanted artifacts from motion to allow anatomical imaging, and allows for functional evaluation of both internal dynamics (e.g., motion) and tissue responses to external dynamics (e.g., driven oxygen changes).

As is known in the art, all MRI data is collected in spatially encoded form and requires software-based decoding ("image reconstruction") to produce an image. Model-based reconstruction allows images to be reconstructed from smaller amounts of data. One class of model-based reconstruction employs either a "global low-rank" or a "local low-rank" model, which exploit dynamic similarities between all pixels or neighboring pixels, respectively, to reduce data acquisition requirements. Such models are used to achieve both high speed and high spatial resolution. When such models are used, images are reconstructed using software to iteratively calculate image model parameters from the acquired imaging data (i.e., the spatially encoded data that is collected). As discussed in detail herein, the model parameters for "global low-rank" and "local low-rank" models are coefficient images (or spatial coefficients) and their corresponding temporal basis functions.

As described in greater detail herein, the disclosed concept comprises both a specialized image acquisition process and custom software that directly calculates some image model parameters, which has considerable computational benefits. These two components are synergistically integrated such that the specialized acquisition specifically enables the direct model parameter calculation. This specialized image acquisition process can be run on virtually any current MRI scanner with minor software alterations on the computer controlling the scanner (typically through channels opened up by scanner vendors expressly for custom software alterations).

Furthermore, conventional fetal and/or placental imaging approaches have much lower frame rates, and therefore are not able to capture fetal cardiac functions. Instead, they either image anatomy or function separately, and have to image individual placentas and fetal organs sequentially. In addition, the fetal/placental imaging is usually done with 2D planes, because 3D isotropic imaging takes too long. The disclosed concept, as described in detail herein, provides advantages that overcome several issues with conventional approaches by providing the ability to: (i) assess both anatomy and function in a single scan, (ii) resolve high-speed features such as the immediate response to external oxygen supply change rather than just a delayed steady-state response, and (iii) resolve multiple incoherent cardiac motions from pregnancy with multiple fetuses in a single 4D isotropic scan.

In the exemplary embodiment, the disclosed concept, as described in detail herein, uses a "local low-rank" reconstruction technique to decode spatially encoded data. The disclosed concept, however, provides the following useful improvements over conventional techniques. First, in addition to acquiring MR imaging data at a large set of spatial encodings, the disclosed concept also interleaves rapid acquisition of subject-specific "training" data at a partial set of spatial encodings (e.g., at one or more particular k-space trajectories). The training data allows for the disclosed concept to directly, rather than iteratively, perform a major step of the model-based image reconstruction process, namely the calculation of temporal basis functions. Furthermore, it should be noted that the training data is acquired concurrently with other imaging data, and does not involve any pre-scans or a priori collected datasets.

Prior to discussing the disclosed concept in more detail, provided below is discussion of certain background MRI principles. It is believed that such an understanding of such principles will aid in the understanding of the details of the disclosed concept.

MRI does not instantaneously capture an image (i.e., it does not "snap a photo"). Rather, in order to create an image, MRI requires that multiple sequential encoded measurements be made, which after they have been collected, can be decoded into an image using various techniques and models. This encoding (i.e., the capture and collection of spatially encoded data) is most commonly in the form of a spatial Fourier transform, meaning that MRI collects data using different spatial frequencies (high frequencies corresponding to sharp edges in an image), which can then be analyzed and reconstructed into an image. This spatial frequency domain is known as "k-space". Collecting more spatial encodings/frequencies leads to more spatial coverage (a wider field of view) and/or higher spatial resolution (sharper images); however, it takes more time to collect this larger set of spatial encodings, lowering the frame rate of dynamic MRI (video MRI) and leaving room for images to be corrupted by motion during the collection process.

Two known image reconstruction techniques/models for image reconstruction (i.e., techniques/models for decoding the collected spatially encoded date to obtain an MR image) are "global low-rank" image reconstruction and "local low-rank" image reconstruction. In order to understand these techniques, first consider a dynamic MR image (i.e., a video) with M total frames. Although there could be tens of frames to hundreds of thousands of frames, depending on the duration and frame rate of the video, every single frame is of the same subject and the same anatomy, so the video frames are correlated to each other and share some information.

A global low-rank model posits that each frame can be expressed as a mixture (specifically a linear combination) of L underlying "template images", or equivalently that the time function at each pixel (or "voxel" in MR terminology) is a mixture of L underlying "temporal basis functions". The main implication of this is that one should not think of the video as M frames, but rather as L template images and L temporal basis functions, where L can be orders of magnitude fewer than M. By only needing to recover L template images and L temporal basis functions rather than M frames, the model relaxes data acquisition requirements, allowing individual frames to be reconstructed from "incomplete" sets of spatial encodings (specifically, lower than the Nyquist rate associated with Fourier encoding).

However, one potential issue with a global low-rank model is that the same L temporal basis functions are shared by every part of the image. This can be problematic in certain applications. For example, when imaging multiple fetuses, the sharing of the same L temporal basis functions by every part of the image is very inefficient, as each individual fetus can move independently of the others, and their heart rates are completely independent of each other as well. Thus, sharing temporal basis functions from one fetus to another is not very useful because, in order to have a large enough set of temporal basis functions to cover all fetuses' motions, L has to become quite high, reducing the utility of the model. A local low-rank model solves this problem by partitioning the image into separate regions, each of which has its own dedicated set of temporal basis functions.

Figure 1:
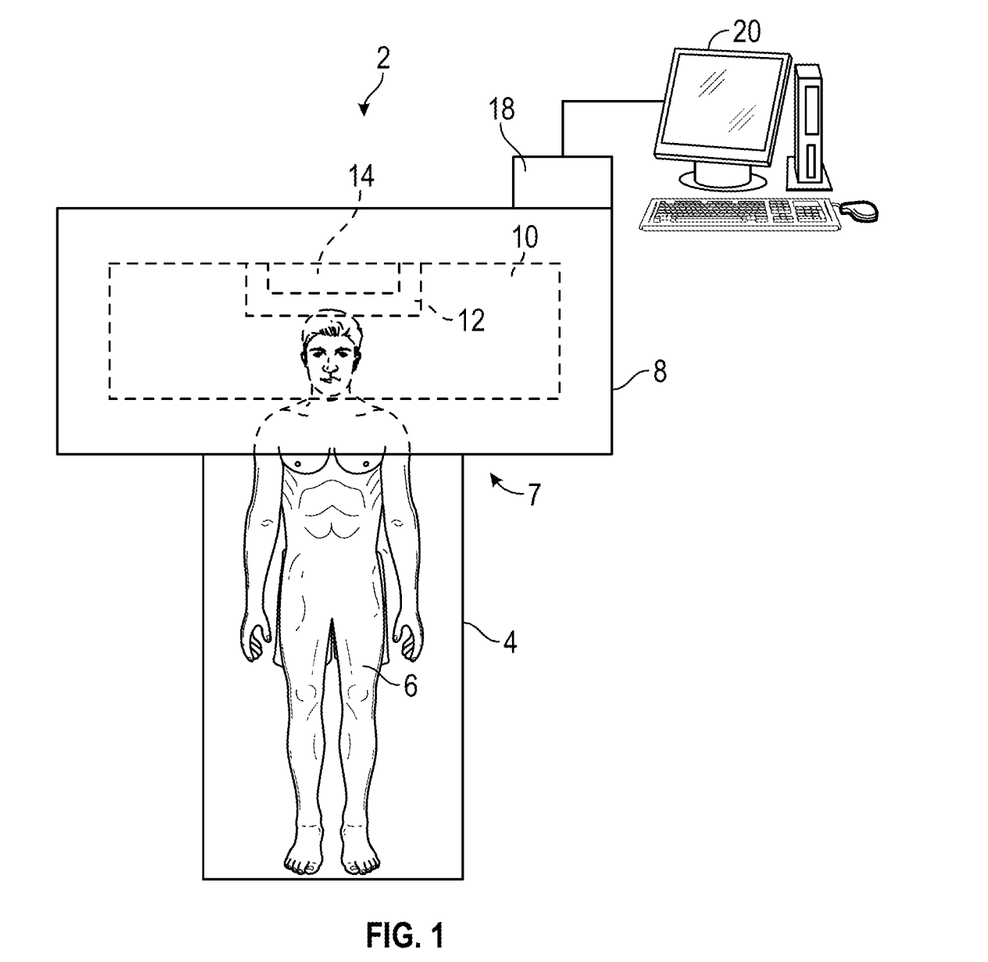
FIG. 1 is a schematic diagram of an MRI system according to an exemplary embodiment in which the various embodiments of the method described herein for generating a 4D MRI image for simultaneous structural/morphological and functional visualization of tissues may be implemented.

FIG. 1 is a schematic diagram of an MRI system 2 according to an exemplary embodiment (which may be a full body scanner or, alternatively, a head only scanner) in which the various embodiments of the method described herein for generating a 4D MRI image for simultaneous structural/morphological and functional visualization of tissues may be implemented. In particular, the image acquisition and generation methods described herein, in the various embodiments, may be implemented as a number of software routines embedded in the control system of MRI system 2.

Referring to FIG. 1, MRI system 2 includes a table 4 on which a patient 6 rests. Table 4 is structured to slide inside a tunnel 7 formed by a housing 8. Housing 8 houses a superconducting magnet 10, which generates a very high magnetic field. Housing 8 also houses a gradient coil 12. Gradient coil 12 is integrated with magnet 10 for adjusting the magnetic field. Housing 8 further houses a Radio Frequency (RF) assembly or system 14, which applies RF pulses to a specific body-part of the patient 6 to be analyzed, and receives signals that are returned by the same body-part. RF assembly or system 14 may be, for example, a surface coil system, a saddle coil system, a Helmholtz coil system, an RF transceiver array system, or any other suitable RF system or structure. A magnetic shield is provided, which surrounds magnet 10, gradient coil 12 and RF system 14, and which minimizes the magnetic fields generated within tunnel 7 from radiating outside the room in which MRI system 2 is located (the magnet shield usually encompasses the entire room). Magnetic shield also protects the inside of tunnel 7 from external magnetic interferences.

MRI system 2 also includes a control module 18 that includes all the components that are required to drive gradient coil system 12 and RF system 14 (for example, a controller, an RF transmitter, an output amplifier, and the like); control module 18 also includes all the components that are required to acquire the response signals from the body-part (for example, an input amplifier, an Analog-To-Digital Converter, or ADC, and the like). Moreover, control module 18 drives an optional motor (not shown) that is used to move the table 4 to and from tunnel 7. Control module 18 is thus structured and configured to generate the signals that are necessary drive MRI system 2 in order to collect the spatially encoded data, including the training data and non-training data (e.g., comprising different k space trajectories), as described in detail herein.

MRI system 2 further includes a computer system 20 (for example, a personal computer, or PC), which is coupled to control module 18. Computer system 20 is configured to control MRI system 2 and to post-process the acquired response signals (e.g., the spatially encoded data including the "training data" and "non-training data" as described herein) according to the method of the disclosed concept. Computer system 20 thus includes a controller having software for performing such post-processing, including the routines for implementing the various embodiments of the method of generating 4D MR images as described herein. Computer system 20 is also configured to display the generated 4D images.

Figure 2:
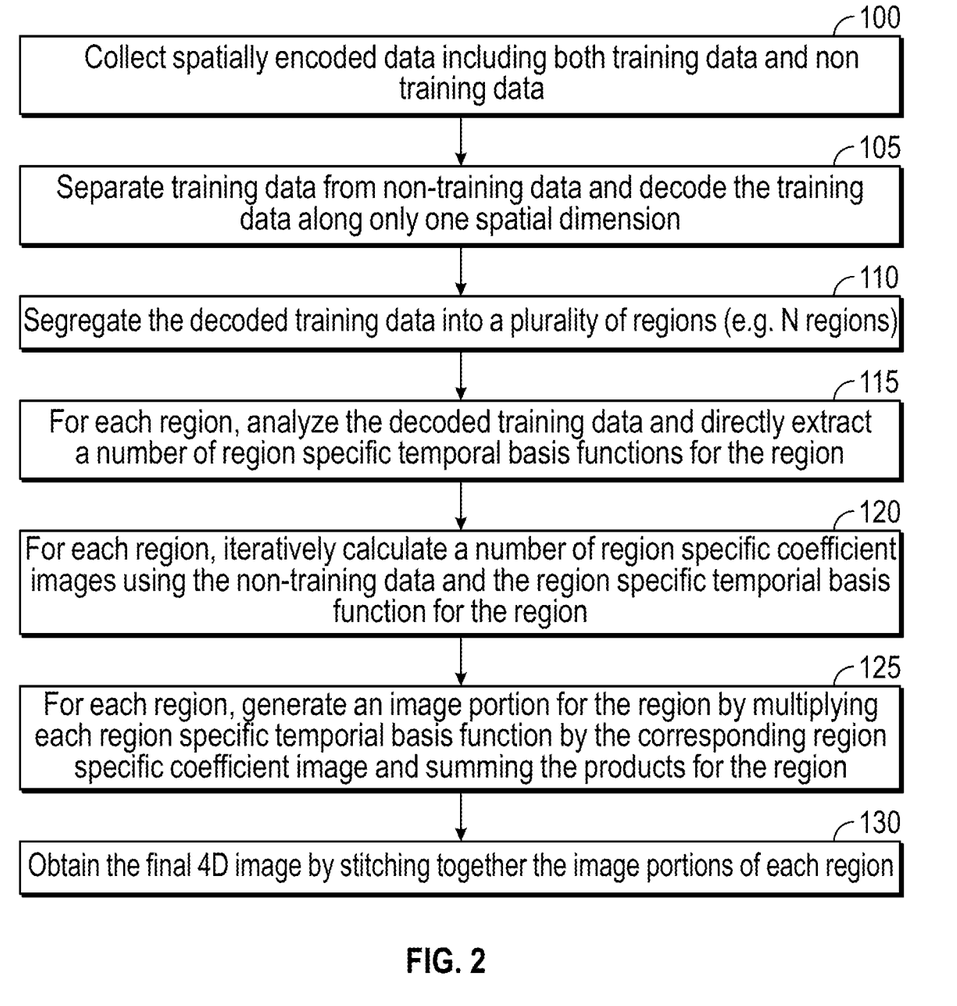
FIG. 2 is a flowchart showing a method of generating a 4D MRI image for simultaneous structural/morphological and functional visualization of tissues according to a non-limiting exemplary embodiment of the disclosed concept.

FIG. 2 is a flowchart showing a method of generating a 4D MRI image for simultaneous structural/morphological and functional visualization of tissues according to a non-limiting exemplary embodiment of the disclosed concept. As described in detail below, the non-limiting exemplary embodiment of the disclosed concept shown in FIG. 2 is based on and utilizes an improved regional local low rank model to express or represent the final 4D image, and is based on certain parameters that are calculated from the spatially encoded data that is collected. As described in detail below, in the non-limiting exemplary embodiment, the model includes and is based on different regions from the subject, wherein certain parameters and image portions are calculated for each region. The final 4D image is then constructed by stitching the image portions from the different regions together. As noted above and as described in detail below, according to an important aspect of the disclosed concept, the method employs both a specialized data acquisition process and a custom technique which directly calculates some image model parameters, and, as a result, has considerable computational benefits. These two aspects of the disclosed concept are synergistically integrated such that the specialized acquisition specifically enables the direct model parameter calculation. For illustrative purposes, the method will be described in connection with the exemplary MRI system 2 and patient 6 shown in FIG. 1, although it will be appreciated that other implementations and configurations are possible within the scope of the disclosed concept.

Referring to FIG. 2, the method begins at step 100, wherein spatially encoded data is collected for patient 6 using MRI system 2. In conventional MRI, when spatially encoded data is collected, each video frame is created by sweeping through an entire set of a plurality of different k space trajectories for each frame (with "entire" meaning the set dictated by the desired spatial coverage, spatial resolution, and available parallel imaging acceleration factor), wherein each k space trajectory consists of a small batch of spatial encodings collected near-instantaneously. In the technique of the disclosed concept, on the other hand, the spatially encoded data is collected in a manner wherein a limited number of k-space trajectories is/are acquired more frequently than all the others by interleaving the acquisition of such limited number of k-space trajectories with the data acquisition of the overall set of entire k space trajectories. The encoded data of the interleaved limited number of k-space trajectories that is collected is referred herein to as "training" data, and the encoded data of the overall set of entire k space trajectories other than the interleaved k space trajectories is referred to herein as "non-training" data. As a result, the spatially encoded data that is collected as a whole at step 100 includes both the training data and the non-training data.

For a simplified example, assume that the entire set of different k space trajectories consists of eight (1-8) space trajectories (although in practice, there are typically thousands to millions). In such an example, with conventional MRI, the eight k space trajectories might be acquired in the following order and would comprise the entirety of the collected spatially encoded data:

1 2 3 4 5 6 7 8 1 2 3 4 5 6 7 8 1 2 3 4 5 6 7 8 1 2 3 4 5 6 7 8

As seen above, this conventional example involves four sequential sweeps through the full set of eight trajectories (1-8), and would lead to four image frames, one frame for each sweep.

In the disclosed concept, on the other hand, assume that the first trajectory (1) is the "limited number of k-space trajectories" that is used for the training data. In this example, the spatially encoded data as a whole may be acquired as follows:

1 1 2 1 3 1 4 1 5 1 6 1 7 1 8 1 1 1 2 1 3 1 4 1 5 1 6 1 7 1 8 1

Figure 3:
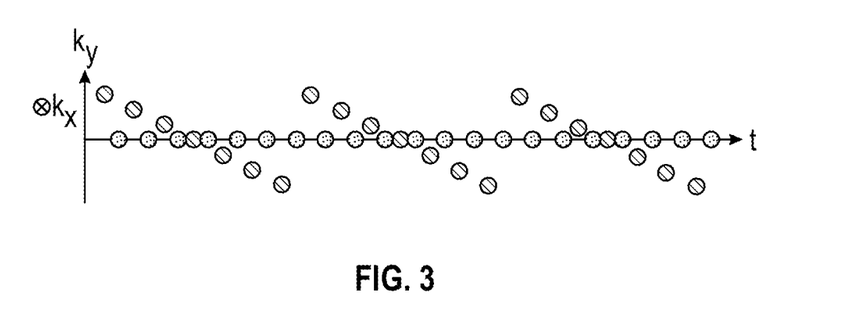
FIG. 3 is a schematic diagram illustrating a method of data acquisition according to a non-limiting exemplary embodiment of the disclosed concept.

As seen above, this approach interleaves sixteen acquisitions of the first trajectory (which is only "partial" because it is not all eight trajectories worth of spatial encodings) into the acquisition far more frequently than all the others. This method of data acquisition is shown schematically in FIG. 3. In FIG. 3, the vertical axis denotes which spatial encoding/k-space trajectory is being acquired, and the horizontal axis is time. As seen, the trajectory for the certain samples on the horizontal axis (the training data—dotted) is collected more often than the other trajectories (hatched).

In addition, as will be appreciated, the training data that is collected is subject-specific because it is not known ahead of time, but instead is collected each time an image is captured. This approach provides sixteen video frames instead of four: one video frame per training data time-point. It should be noted that the data acquisition according to the disclosed concept is not limited to the specific example above (i.e., the training data does not have to be collected every other acquisition). In other words, the training and non-training data does not have to be acquired in the specific order shown in the example above, or in any specific order or distribution for that matter. Rather, the acquisition of the training data as interleaved with the non-training data acquisition can be non-uniform and/or random, there can be cycles through multiple trajectories for the training data, and/or the training data acquisition can be less frequent than shown above. In addition, in the exemplary embodiment of the disclosed concept, the training data is of one dimension only and is a particular k-space trajectory known as a projection line or Cartesian trajectory.

Referring again to FIG. 2, following the collection of the spatially encoded data at step 100 as just described, the method proceeds to step 105. At step 105, the training data is separated from the non-training data. Then, the training data is partially decoded along only one spatial dimension (i.e., the spatial dimension of the particular k space trajectory that is the training data, namely a projection line or Cartesian trajectory in the exemplary embodiment). Next, at step 110, the decoded training data is segregated into a plurality of (e.g., N) spatial regions. The number and/or boundaries of the spatial regions can be either manually selected by a user or automatically selected. One option for automatic selection is to evaluate several boundary options (extracting temporal basis functions for each possible region definition) and choose the boundaries for which a small number of temporal basis functions best describe the training data. "Best" can be defined several ways, and in the exemplary embodiment can be described as "minimum Euclidean distance between the training data and the subspace spanned by the temporal basis functions." Following step 110, the method proceeds to step 115.

At step 115, for each region, the decoded training data is analyzed to directly extract a number of region specific temporal basis functions for the region. In the exemplary embodiment, this is done using singular value decomposition, although other suitable decoding methods are also possible. In addition, in the exemplary embodiment, the same number of region specific temporal basis functions are extracted for each region. Thus, in this exemplary embodiment, if there are N regions and if L temporal basis functions extracted for each region, there will be a total of N*L temporal basis functions extracted at step 115. This, however, is meant to be exemplary only, and the disclosed concept contemplates that the number of extracted temporal basis functions may vary across the regions. In embodiments where the number of extracted temporal basis functions varies from region-to-region (call each one Ln), then step 115 will result in the generation of $\Sigma^N_{n=1} L_n$ total temporal basis functions.

Next, the method proceeds to step 120. At step 120, for each region, a number of region specific coefficient images are iteratively calculated using the non-training data and the region specific temporal basis function for the region (the spatial extent of these coefficient images are each limited to one region, and are zero elsewhere). More specifically, in step 120, the goal of the process is to find a set of spatial coefficient images which, if multiplied by the temporal basis functions and spatially re-encoded the same way the MRI scanner did during acquisition, would best match the acquired k-space data (the non-training data). This process commences with an initial guess of the coefficient images, and iteratively updates and improves that guess. A number of different suitable techniques for performing this iterative analysis are known and may be used in connection with this step of the disclosed concept. For example, a conjugate gradient implementation could minimize least-squares data-consistency with or without an additional quadratic regularization penalty; alternatively, an alternating direction method of multipliers or fast iterative shrinkage-thresholding algorithm implementation could minimize least-squares data-consistency as well as an additional non-quadratic regularization penalty.

The method then proceeds to step 125. At step 125, for each region, an image portion for that region is generated by first multiplying each region specific temporal basis function by the corresponding region specific coefficient image and then summing the products for the region. Then, at step 130, the final 4D image is obtained by stitching together the image portions from each of the regions. These process steps are summarized by the following low-rank model for the image A(r, t) (for voxel location r and time t):

$$A(r, t) = \begin{cases} \sum_{l=1}^{L} u_l(r)\emptyset_{l,1}(t), & r \in \text{region } 1 \\ \sum_{l=1}^{L} u_l(r)\emptyset_{l,2}(t), & r \in \text{region } 2 \\ \vdots \\ \sum_{l=1}^{L} u_l(r)\emptyset_{l,N}(t), & r \in \text{region } N \end{cases}$$

where $u_l(r)$ are L spatial coefficient images and $\emptyset_{l,N}(t)$ are L temporal basis functions.

In the exemplary embodiment just described, all of the temporal basis functions that are extracted are used only in connection with the associated region. This exemplary embodiment, however, is just one implementation and is not meant to be limiting. Rather, the disclosed concept also contemplates alternative embodiments that are hybrid global/local models, where some truly global temporal basis functions, such as maternal motion affecting all fetuses, are shared across image regions, but other local temporal basis functions, such as individual fetal motion, are assigned to specific image regions. In addition the image regions are not limited to square or cube "patches", but instead may be adaptively defined based on the actual fetal locations and sizes.

One particular, non-limiting exemplary embodiment of the disclosed concept uses a hybrid, low-rank and sparse model to perform 4D BOLD imaging in utero. The low-rank model expresses the image ρ(r, t) (for voxel location r and time t) as:

$$\rho(r, t) \sum_{\ell=1}^{L} \psi_\ell(r)\varphi_\ell(t),$$

where $\{\psi_\ell(r)\}_{\ell=1}^{L}$ are L spatial coefficient maps and where $\{\psi_\ell(t)\}_{\ell=1}^{L}$ are L temporal basis functions. In matrix form, this becomes X=ΨΦ, where $X_{ij}=\rho(r_i, t_j)$, $\Psi_{ij}=\psi_j(r_i)$, and $\phi_{ij}=\varphi_i(t_j)$. Additionally ρ(r, t) is modelled as being transfer sparse, specifically in the spatial-spectral domain (i.e., model $\mathcal{F}_t\{\rho(r, t)\}$ as sparse, where $\mathcal{F}_t$ is the temporal Fourier transform). This approach exploits both image correlation and transform sparsity to allow high spatiotemporal resolution imaging.

In this embodiment, image reconstruction is performed in two steps: first determining the temporal basis Φ from the singular value decomposition (SVD) of interleaved training data, and second determining the spatial coefficient maps Ψ by fitting the temporal basis to the remainder of the imaging data. This second step is calculated according to $$\Psi = \underset{\Psi}{\mathrm{argmin}} \|d - E(\Psi\Phi)\|_2^2 + \lambda\|\Psi\Phi F\|_1,$$

where d are the measured data, E is the encoding operator comprising spatial encoding and undersampling, and F is the temporal Fourier transform.

Moreover, according to a further aspect of the disclosed concept, once the dynamic 4D is generated as described herein, it may be used for any of a number of potential measurements and applications including, without limitation, complex signals (signal+phase together), cine fetal CMR, oxygen tension mapping (static), oxygen consumption mapping (i.e. dynamic oxygen mapping to look at different oxygen consumption over time at each compartment/organ), BOLD responses including normal to hyperoxygenation and oscillating hypoxia challenge to probe mitochondrial functions, blood flow (e.g., in the uterine artery, the spiral artery, and fetal vascular 3D angiography 4D flow), spin tagging (ASL or PCASL), substrate delivery (by exogenous contrast agent), automatic diagnosis, and ROS with spin trapping.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A magnetic resonance imaging method, comprising:
   collecting spatially encoded data from a subject using an MRI system;
   directly extracting a number of temporal basis functions using at least a first portion of the spatially encoded data;
   after directly extracting the number of temporal basis functions, iteratively calculating a number of coefficient images using the number of temporal basis functions and at least a second portion of the spatially encoded data; and
   generating a 4D image based on the number of temporal basis functions and the number of coefficient images, wherein the 4D image comprises a plurality of spatial regions, and wherein the directly extracting a number of temporal basis functions comprises partially spatially decoding the spatially data by decoding only the at least a first portion of the spatially encoded data to create decoded data and extracting the number of temporal basis function for each of the plurality of spatial regions from the decoded data.

2. The magnetic resonance imaging method according to claim 1, wherein the extracting the number of temporal basis functions for each of the number of spatial regions from the decoded data employs singular value decomposition.

3. The magnetic resonance imaging method according to claim 1, wherein the spatially encoded data comprises training data and non-training data, and wherein the at least a first portion of the spatially encoded data comprises the training data and the at least a second portion of the spatially encoded data comprises the non-training data.

4. The magnetic resonance imaging method according to claim 3, wherein the non-training data comprises data for a plurality of k-space trajectories, and wherein the training data comprises data for a subset of the plurality of k-space trajectories or for a separate plurality of additional trajectories.

5. The magnetic resonance imaging method according to claim 4, wherein the decoding only the at least a first portion of the spatially encoded data to create decoded data comprises decoding only the training data to create decoded training data, wherein the directly extracting the number of temporal basis functions comprises: (i) segregating the decoded training data into the plurality of spatial regions, and (ii) for each of the spatial regions, analyzing the decoded training data that corresponds to the spatial region to create a number of region specific temporal basis functions for the spatial region.

6. The magnetic resonance imaging method according to claim 5, wherein the iteratively calculating the number of coefficient images comprises, for each of the spatial regions, iteratively calculating a number of region specific coefficient images using the region specific temporal basis functions for the spatial region and the non-training data.

7. The magnetic resonance imaging method according to claim 6, wherein the generating a 4D image comprises generating an image portion for each spatial region using the region specific temporal basis functions for the spatial region and the number of region specific coefficient images for the spatial region, and combining the image portions to create the 4D image.

8. The magnetic resonance imaging method according to claim 1, wherein during the iteratively calculating the number of coefficient images using the number of temporal basis functions, one or more of the number of temporal basis functions are shared by a plurality of the spatial regions.

9. The magnetic resonance imaging method according to claim 1, wherein the spatial regions are anisotropic, not equally sized, and/or chosen adaptively or anatomically rather than by a fixed patch size.

10. A non-transitory computer readable medium storing one or more programs, including instructions, which when executed by a computer, causes the computer to perform the method of claim 1.

11. A magnetic resonance imaging system, comprising:
    a magnet;
    an RF system; and
    a controller structured and configured for:
      causing spatially encoded data to be collected from a subject using the magnet and the RF system;
      directly extracting a number of temporal basis functions using at least a first portion of the spatially encoded data;
      after directly extracting the number of temporal basis functions, iteratively calculating a number of coefficient images using the number of temporal basis functions and at least a second portion of the spatially encoded data; and
      generating a 4D image based on the number of temporal basis functions and the number of coefficient images, wherein the 4D image comprises a plurality of spatial regions, and wherein the directly extracting a number of temporal basis functions comprises partially spatially decoding the spatially encoded data by decoding only the at least a first portion of the spatially encoded data to create decoded data and extracting the number of temporal basis functions for each of the plurality of spatial regions from the decoded data.

12. The magnetic resonance imaging system according to claim 11, wherein the extracting the number of temporal basis functions for each of the number of spatial regions from the decoded data employs singular value decomposition.

13. The magnetic resonance imaging system according to claim 11, wherein the spatially encoded data comprises training data and non-training data, and wherein the at least a first portion of the spatially encoded data comprises the training data and the at least a second portion of the spatially encoded data comprises the non-training data.

14. The magnetic resonance imaging system according to claim 13, wherein the non-training data comprises data for a plurality of k-space trajectories, and wherein the training data comprises data for a subset of the plurality of k-space trajectories or for a separate plurality of additional trajectories.

15. The magnetic resonance imaging system according to claim 14, wherein the decoding only the at least a first portion of the spatially encoded data to create decoded data comprises decoding only the training data to create decoded training data, wherein the directly extracting the number of temporal basis functions comprises: (i) segregating the decoded training data into the plurality of spatial regions, and (ii) for each of the spatial regions, analyzing the decoded training data that corresponds to the spatial region to create a number of region specific temporal basis functions for the spatial region.

16. The magnetic resonance imaging system according to claim 11, wherein the iteratively calculating the number of coefficient images comprises, for each of the spatial regions, iteratively calculating a number of region specific coefficient images using the region specific temporal basis functions for the spatial region and the non-training data.

17. The magnetic resonance imaging system according to claim 16, wherein the generating a 4D image comprises generating an image portion for each spatial region using the region specific temporal basis functions for the spatial region and the number of region specific coefficient images for the spatial region, and combining the image portions to create the 4D image.

18. The magnetic resonance imaging system according to claim 11, wherein during the iteratively calculating the number of coefficient images using the number of temporal basis functions, one or more of the number of temporal basis functions are shared by a plurality of the spatial regions.

19. The magnetic resonance imaging system according to claim 11, wherein the spatial regions are anisotropic, not equally sized, and/or chosen adaptively or anatomically rather than by a fixed patch size.

* * * * *

UNITED STATES PATENT AND TRADEMARK OFFICE
CERTIFICATE OF CORRECTION

PATENT NO. : 11,828,825 B2
APPLICATION NO. : 17/245342
DATED : November 28, 2023
INVENTOR(S) : Yijen Liu Wu and Anthony Christodoulou It is certified that error appears in the above-identified patent and that said Letters Patent is hereby corrected as shown below:

In the Claims

In Claim 1, Line 55, insert the word --encoded-- after "spatially" and before "data".

In Claim 1, Line 58, the word "function" should be changed to --functions--.

Signed and Sealed this
Twenty-third Day of January, 2024

Katherine Kelly Vidal
*Director of the United States Patent and Trademark Office*